United States Patent

Burns

[15] 3,647,445

[45] Mar. 7, 1972

[54] STEP AND REPEAT PHOTOMASK AND METHOD OF USING SAME

[72] Inventor: Carmen D. Burns, Plano, Tex.

[73] Assignee: Texas Instruments Incorporated, Dallas, Tex.

[22] Filed: Oct. 24, 1969

[21] Appl. No.: 869,218

[52] U.S. Cl. ....................................96/35, 96/36.2, 96/38.4

[51] Int. Cl. ....................................G03c 5/00

[58] Field of Search ....................96/36, 36.1, 36.2, 38.3, 38.4, 96/44, 35; 156/11, 17, 8

[56] References Cited

UNITED STATES PATENTS

| | | | |
|---|---|---|---|
| 2,286,833 | 6/1942 | Weber | 96/44 X |
| 3,245,794 | 4/1966 | Conley | 96/44 |
| 3,476,561 | 11/1969 | Bertelson et al. | 96/36.2 X |
| 3,477,848 | 11/1969 | Pritchard | 96/36.2 X |
| 3,518,084 | 6/1970 | Barson et al. | 96/38.4 X |

OTHER PUBLICATIONS

Castrucci et al., " Pinhole Elimination During Fabrication of Semiconductor Devices," IBM Technical Disc. Bull., Vol. 11, No. 9, 2/1969, pp. 1078- 1079.

*Primary Examiner*—John T. Goolkasian
*Assistant Examiner*—Joseph C. Gil
*Attorney*—James O. Dixon, Andrew M. Hassell, Harold Levine, Melvin Sharp, John E. Vandigriff, Henry T. Olsen and Michael A. Sileo, Jr.

[57] ABSTRACT

A method is described for exposing a layer of photoresist so as to eliminate the defects which would otherwise be caused by a defective photomask. The method utilizes a unique mask in which the repetitive opaque patterns are identical except that the patterns in alternate rows are slightly larger than the patterns in the other alternate rows. The photomask is aligned with the photoresist in the usual manner and the photoresist exposed. Then the photomask is indexed one row and the photoresist again exposed so that all areas of the photoresist are double exposed through different portions of the photomask, yet the edges of the unexposed areas are defined by a single exposure corresponding in size to the patterns in the rows which have the larger opaque areas.

8 Claims, 4 Drawing Figures

INVENTOR:
CARMEN D. BURNS

Gary C. Honeycutt
ATTORNEY

STEP AND REPEAT PHOTOMASK AND METHOD OF USING SAME

This invention relates generally to lithographic processes, and more particularly relates to lithographic processes used in the manufacture of semiconductor devices and the like.

In the manufacture of semiconductor devices, a large number of identical units are formed on a single slice of semiconductor material that is typically one to two inches in diameter. For example, several hundred identical transistors may be fabricated on one silicon using the same process steps. In general, a transistor is fabricated by two or more diffusion procedures. Each diffusion is made by forming a layer of oxide over the silicon slice, coating the oxide with a layer of photoresist, exposing the photoresist in a predetermined pattern through a photomask, developing the photoresist to remove the resist in preselected areas and thereby expose the oxide and removing the exposed oxide with an etchant to thereby expose the underlying silicon in preselected areas. After the photoresist is stripped away, selected impurities are diffused through the openings in the oxide. The latter step regrows the oxide layer over the slice. This sequence of steps is repeated for each diffusion.

Finally, the oxide layer is again coated with photoresist which is exposed through a photomask and developed to form openings to permit the oxide layer to be selectively etched away in the areas where electrical contact is to be made with the silicon. After the photoresist is stripped away, a metallized layer is evaporatively deposited over the entire slice, the metallized layer coated with photoresist which is exposed and developed to leave photoresist only where the metal is to remain to form expanded electrical contact pads which extend through an opening into contact with the various regions of the semiconductor material. The expanded contacts then can be connected to extend leads of the transistor package by means of ballbonded wires or other techniques.

During each step of the process, it is vitally important that the photomask be precisely aligned with the structures previously formed on the semiconductor slice. This is achieved, by first raising the slice into contact with the photomask to level the slice. Then the slice is lowered a very short distance and the pattern on the slice aligned with the photomask before the slice is again raised into contact with the photomask for exposure. Because of the very small size of the patterns on the photomask, the photomask is invariably brought into contact with the slice several times before the necessary alignment accuracy is achieved. Each time the photomask contact the slice, there is a likelihood that the photomask will be contaminated by material picked up from the surface of the photoresist. There is also a likelihood that microprojections from the face of the slice may actually penetrate the emulsion of the photomask causing an opening in an other opaque area. As a result of these effects, a photomask is useful for a limited number of exposures before the mask becomes sufficiently contaminated or punctured as to reduce the yield of devices below the point where it is more economical to replace the photomask.

It has heretofore been proposed to remedy many of these defects by the so-called double-coat, double-exposed procedure wherein the steps of applying and exposing a coat of photoresist is merely repeated using a different photomask. Such a procedure, however, has not received a widespread acceptance because of the added expense and the failure to produce the anticipated results. One of the problems with the double-coat, double-expose procedures is that twice as many photomasks are required. This materially negates the cost saving resulting from the increased yield.

This invention is concerned with a method which substantially increases the useful life of a photomask. In accordance with the method of the present invention, a photomask is aligned and brought into contact with a slice coated with photoresist which is then exposed. Then the slice is lowered and the photomask is moved a predetermined distance in a predetermined direction so that each pattern on the mask is aligned with a related pattern previously exposed on the photoresist, then the slice is again raised against the photomask and the photoresist is again exposed. As a result, the areas of the photoresist which are to be exposed are double exposed, thus greatly reducing the likelihood that an area which should be exposed is not. The invention is also concerned with a photomask for carrying out the method.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figures 1, 2:
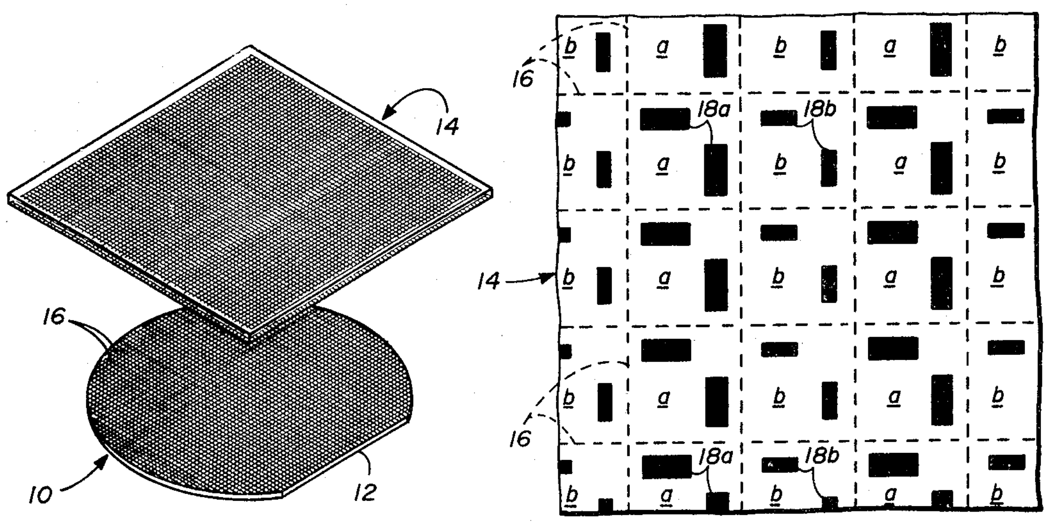
FIG. 1 is a simplified perspective view of a photomask in accordance with this invention and a conventional semiconductor slice.
FIG. 2 is an enlarged plan view of a portion of the photomask of FIG. 1 in accordance with the present invention.

Referring now to the drawings, and in particular to FIG. 1, a semiconductor slice is indicated generally by the reference numeral 10. The semiconductor slice is typically made of single crystal silicon and is nominally about two inch in diameter. A flattened portion 12 is provided to assist in handling and aligning the slice 10.

A typical photomask in accordance with the present invention is indicated generally by the reference numeral 14. The photomask 14 is typically a plate of glass coated with a developed photographic emulsion over the face adjacent the slice 10. The emulsion of the photomask has a pattern of opaque and transparent areas as represented in FIG. 2. These patterns are generally repetitive in areas defined by the crossed lines 16. The repetitive patterns are typically quite complex, depending upon the particular semiconductor device being fabricated, and are greatly simplified in FIG. 2 for purposes of illustration.

Figure 3:
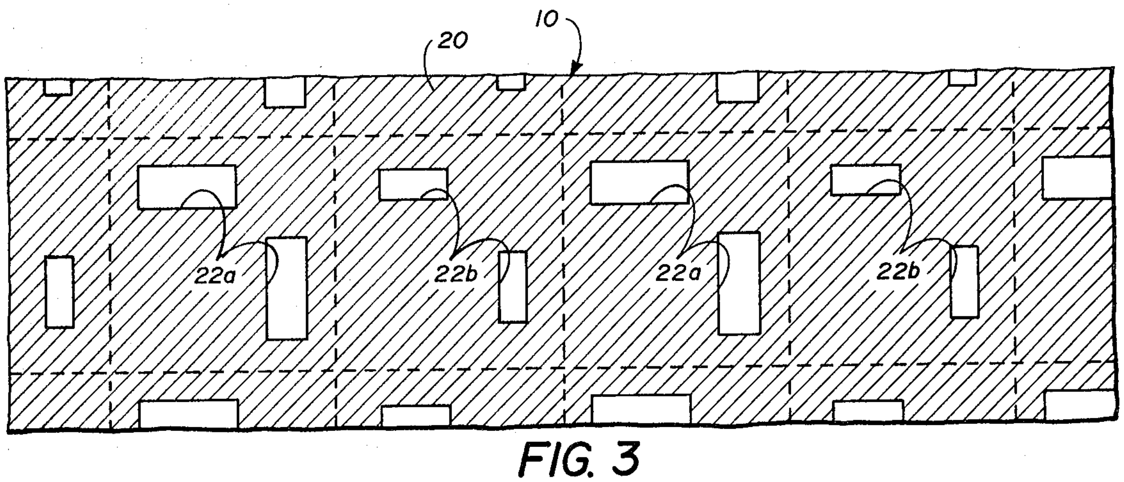
FIG. 3 is an enlarged plan view of the pattern produced by the first exposure using the photomask of FIG. 2.
Figure 4:
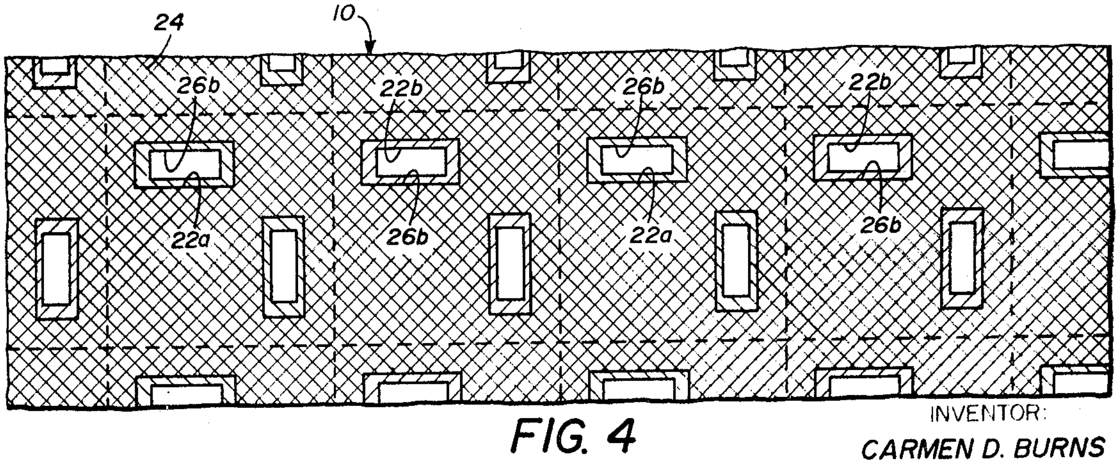
FIG. 4 is a plan view of the pattern produced after the second exposure using the photomask of FIG. 2 in accordance with the method of the present invention.

In accordance with an important aspect of the invention, opaque patterns **18*a*** in the repetitive areas designated by the reference character *a* are larger than the opaque patterns **18*b*** in the repetitive areas designated by the reference character *b* although the general shape and location within the respective areas are the same. The difference in size of the patterns will typically be from 0.005 inch to 0.0001 inch depending upon the accuracy with which the mask 14 can be indexed as will presently be described. This difference in the dimensions of the opaque areas is greatly exaggerated in FIGS. 2, 3 and 4 for purposes of illustration. It will be noted that the areas *a* and *b* are always alternated along the horizontal axis in the drawings.

In carrying out the method of the present invention, the mask 14 is aligned with the slice 12 and the photoresist on the slice 12 exposed in the conventional manner. This produces the pattern illustrated in FIG. 3 with the photoresist being exposed in the areas indicated by the diagonal lines 20. The areas shown by the outlines **22*a* and 22*b* are left unexposed as a result of the opaque areas 18*a* and 18*b*** in the respective areas *a* and *b* of the mask 14.

The photomask 14 is then indexed so that the areas **18*a* of the mask are precisely aligned with the areas 22*b* which were left unexposed by the first exposure, and so that the areas 18*b* are precisely aligned within areas 22*a* left unexposed in the first exposure. The photoresist on the slice 12 is then again exposed through the mask in the area represented by the diagonal lines 24** in FIG. 4.

As a result, each repetitive area of the photoresist is exposed in exactly the same manner with the smaller areas **22*b* and 26*b* while all area outside the larger areas 22*a* and 26*a* have been exposed twice. Thus, any contamination which was in the transparent areas of the mask 14** does not result in a portion of the photoresist being unexposed that should be exposed except in the extremely unlikely even that contamination exist in exactly the same position in both of the repetitive areas.

It is important to have the opaque pattern in the areas *a* and *b* of slightly different size as described so that edge definition is not lost as a result of the double exposure. The differences in the size should be as small as possible, however, in order to reduce the total area that is exposed only one time. Thus, the difference in size between the corresponding opaque areas 18*a* and 18*b* should be approximately equal to the accuracy with which the mask 14 can be repetitively repositioned for the second exposure.

The method and apparatus described above is useful for both positive and negative photoresist. However, the type of photoresist should be selected so that the area of the photomask that is opaque is substantially less than the area that is transparent. This is because defects in the transparent areas, which are invariably unwanted opaque areas, are eliminated by the double exposure, while defects in the normally opaque areas such as scratches and openings, are doubled by the double exposure process. However, defects in clear areas result in openings in the oxide which usually destroy the devices while openings in the opaque areas merely result in oxide islands which adversely affect the semiconductor device only in a small number of cases, so that significant net gain in yield is achieved. As a general rule, the smaller the opaque areas, the greater the benefit to be derived from the present invention. In the fabrication of semiconductor devices, this is usually the case. However, it is to be understood that the invention is also applicable in the manufacture of chrome photomasks, as well as other photolithographic processes.

Although a preferred embodiment of the invention has been described in detail, it is to be understood that various changes, substitutions and alternations can be made therein without departing from the spirit and scope of the invention.

What is claimed is:

1. A method for photographically forming a protective mask selectively exposing an underlying substrate in which the boundaries of the protected and unprotected areas of said mask are accurately defined by a single exposure photographic process and in which all other protected areas are defined by a double-exposure process, the method consisting of the steps of:

a. forming a layer of photosensitive material on a substrate;
b. forming an exposure mask having geometrically similar patterns of transparent and opaque regions;
c. exposing said layer of photosensitive material to light through said exposure mask such that selected first regions of said layer of photosensitive material are unexposed and selected second regions of said layer of photosensitive material are single exposed to produce geometrically similar single exposed second regions
d. repositioning said exposure mask and reexposing said layer of photosensitive material to light through said repositioned exposure mask such that a selected portion of said first regions remain unexposed with the remaining portion thereof being single exposed, and a selected portion of said second regions remain single exposed with the remaining portion thereof being double exposed,
e. photographically developing said layer of photosensitive material to form a protective mask which selectively exposes said underlying substrate.

2. A method for photographically forming a protective mask which is substantially free of defects due to irregularities in the transparent regions of an exposure mask which is used to define the protective mask, the method consisting of the steps of:

a. forming a layer of photosensitive material on the surface of a substrate;
b. exposing said layer of photosensitive material to light through said exposure mask, said exposure mask having at least first and second patterns of transparent and opaque regions, said first and second patterns being related such that they are substantially identical in outline and orientation, except that said opaque regions in said second patterns are larger than the corresponding regions in said first pattern;
c. repositioning said exposure mask with respect to said substrate and reexposing said layer of photosensitive material through said exposure mask thereby forming areas in said photosensitive layer which are unexposed, each of said unexposed areas being substantially symmetrically surrounded by an area which is single-exposed with the remainder of said photosensitive layer being double-exposed; and
d. developing and selectively removing portions of said photosensitive layer thereby forming a protective mask which is substantially free of irregularities due to defects in the transparent regions of said exposure mask.

3. A method for photographically forming a protective mask in accordance with claim 2 wherein said exposure mask is in contact with said photosensitive layer during the exposure process.

4. A method of photographically forming a protective mask in accordance with claim 2 wherein said layer of photosensitive material is formed by coating a semiconductor substrate with photoresist and curing said photoresist.

5. A method for photographically forming a protective mask in accordance with claim 4 in which said semiconductor substrate is coated with an insulating layer prior to the formation of said layer of photosensitive material.

6. A mask for selectively exposing a photosensitive layer comprising:

a. a transparent mask having first and second geometrically similar opaque patterns therein, said patterns being similarly oriented with respect to at least one common axis, such that said photosensitive layer can be exposed such that first regions will not be exposed, second regions will be double exposed and third regions will be single-exposed by positioning said mask above said photosensitive layer, projecting light through said mask, indexing said mask with respect to said photosensitive layer and projecting light through said mask a second time.

7. The photomask of claim 6 wherein said first patterns comprise a first plurality of identical patterns and wherein said second pattern comprises a second plurality of identical patterns with said first and second patterns alternately repeating along at least one axis.

8. The photomask of claim 6 wherein said first pattern comprises a plurality of identical patterns, and wherein said second pattern comprises a plurality of identical patterns with said patterns alternately repeating along at least two axis of said photomask.

* * * * *